(12) United States Patent
Harper

(10) Patent No.: US 9,048,289 B2
(45) Date of Patent: Jun. 2, 2015

(54) FORMATION OF THIN LAYERS OF SEMICONDUCTOR MATERIALS

(75) Inventor: Robert Cameron Harper, Newport (GB)

(73) Assignee: IQE Silicon Compounds Limited, South Glamorgan, Wales (GB)

( * ) Notice: Subject to any disclaimer, the term of this patent is extended or adjusted under 35 U.S.C. 154(b) by 374 days.

(21) Appl. No.: 13/202,401

(22) PCT Filed: Feb. 17, 2010

(86) PCT No.: PCT/GB2010/000287
§ 371 (c)(1),
(2), (4) Date: Aug. 19, 2011

(87) PCT Pub. No.: WO2010/094920
PCT Pub. Date: Aug. 26, 2010

(65) Prior Publication Data
US 2011/0303291 A1  Dec. 15, 2011

(30) Foreign Application Priority Data
Feb. 19, 2009  (GB) .................................. 0902848.1

(51) Int. Cl.
*H01L 21/762* (2006.01)
*H01L 21/02* (2006.01)

(52) U.S. Cl.
CPC ..... *H01L 21/76254* (2013.01); *H01L 21/02381* (2013.01); *H01L 21/02395* (2013.01); *H01L 21/02532* (2013.01); *H01L 21/02546* (2013.01)

(58) Field of Classification Search
None
See application file for complete search history.

(56) References Cited

U.S. PATENT DOCUMENTS

| | | | |
|---|---|---|---|
| 4,119,994 A * | 10/1978 | Jain et al. ...................... | 257/198 |
| 4,171,235 A | 10/1979 | Fraas et al. | |
| 4,370,510 A | 1/1983 | Stirn | |
| 6,281,426 B1 | 8/2001 | Olson et al. | |
| 6,380,601 B1 | 4/2002 | Ermer et al. | |
| 6,750,130 B1 | 6/2004 | Fitzgerald | |
| 7,297,612 B2 * | 11/2007 | Langdo et al. ................ | 438/458 |

(Continued)

FOREIGN PATENT DOCUMENTS

| | | |
|---|---|---|
| EP | 1 109 230 A2 | 6/2001 |
| EP | 1 519 409 A1 | 3/2005 |

(Continued)

OTHER PUBLICATIONS

Nakajima, K., et al., "Growth of Ge-rich $SixGe_{1-x}$ Single Crystal with Uniform Composition (x=0.02) on a Compositionally Graded Crystal for Use as GaAs Solar Cells," *Journal of Crystal Growth* 205(3):270-276 (1999).

(Continued)

*Primary Examiner* — Charles Garber
*Assistant Examiner* — Stanetta Isaac
(74) *Attorney, Agent, or Firm* — Hamilton, Brook, Smith & Reynolds, P.C.

(57) ABSTRACT

There is disclosed a method of forming layers of either GaAs or germanium materials such as SiGe. The germanium material, for example, may be epitaxially grown on a GaAs surface. Layer transfer is used to transfer the germanium material, along with some residual GaAs, to a receiver substrate. The residual GaAs may be then removed by selective etching, with the boundary between the GaAs and the germanium material providing an etch stop.

23 Claims, 8 Drawing Sheets

(56) References Cited

U.S. PATENT DOCUMENTS

| | | | |
|---|---|---|---|
| 7,387,947 B2* | 6/2008 | Cayrefourcq et al. | 438/458 |
| 2002/0040727 A1 | 4/2002 | Stan et al. | |
| 2002/0072130 A1 | 6/2002 | Cheng et al. | |
| 2002/0168864 A1 | 11/2002 | Cheng et al. | |
| 2003/0186521 A1* | 10/2003 | Kub et al. | 438/558 |
| 2004/0040493 A1 | 3/2004 | Vineis et al. | |
| 2004/0150006 A1 | 8/2004 | Aulnette et al. | |
| 2004/0173791 A1 | 9/2004 | Cheng et al. | |
| 2005/0003599 A1* | 1/2005 | Yeo et al. | 438/200 |
| 2005/0042842 A1 | 2/2005 | Lei et al. | |
| 2005/0124137 A1 | 6/2005 | Yonehara | |
| 2005/0212061 A1* | 9/2005 | Langdo et al. | 257/397 |
| 2005/0245049 A1 | 11/2005 | Akatsu et al. | |
| 2006/0021565 A1* | 2/2006 | Zahler et al. | 117/89 |
| 2006/0144435 A1 | 7/2006 | Wanlass | |
| 2006/0172505 A1 | 8/2006 | Koester et al. | |
| 2007/0051975 A1 | 3/2007 | Figuet et al. | |
| 2007/0277728 A1 | 12/2007 | Sadaka et al. | |
| 2008/0211061 A1 | 9/2008 | Atwater, Jr. et al. | |
| 2011/0303273 A1 | 12/2011 | Harper | |

FOREIGN PATENT DOCUMENTS

| | | |
|---|---|---|
| EP | 1 763 069 A1 | 3/2007 |
| EP | 1 777 753 A1 | 4/2007 |
| GB | 2 400 731 A | 10/2004 |
| JP | 4048658 A | 2/1992 |
| KR | 200560982 A | 12/2003 |
| WO | WO 02/15244 | 2/2002 |
| WO | WO 02/33746 A1 | 4/2002 |
| WO | WO 2004/054003 A1 | 6/2004 |
| WO | WO 2006/015185 A2 | 2/2006 |
| WO | WO 2008/132569 A1 | 11/2008 |
| WO | WO 2009/005824 A1 | 1/2009 |
| WO | WO 2009/135078 | 11/2009 |
| WO | WO 2010/075606 | 7/2010 |
| WO | WO 2010/094919 A3 | 8/2010 |

OTHER PUBLICATIONS

United Kingdom Search Report for GB0902848.1, Dated: May 20, 2009.

United Kingdom Further Search Report for GB0902848.1, Dated: Nov. 13, 2009.

International Search Report and Written Opinion for PCT/GB2010/000287, Dated: May 27, 2010.

$2^{nd}$ Notice of Office Action for CN Application No. 201080014929.X, Date of Issuance: Apr. 22, 2014.

\* cited by examiner

FORMATION OF THIN LAYERS OF SEMICONDUCTOR MATERIALS

This application is the U.S. National Stage of International Application No. PCT/GB2010/000287, filed Feb. 17, 2010, which designates the U.S., published in English, and claims priority under 35 U.S.C. §§119 or 365(c) to Great Britain Application No. 0902848.1, filed Feb. 19, 2009.

FIELD OF THE INVENTION

The present invention relates to methods of forming thin layers of a semiconductor materials.

INTRODUCTION

Due to its relative scarcity it is unlikely that future demand for Ge based technologies will be readily satisfied using bulk Ge semiconductor substrates. This is especially relevant at larger substrate wafer diameters for which thicker Ge is required per unit area to provide adequate mechanical strength. Germanium on insulator (GeOI) wafers present a feasible alternative. Just a small fraction (typically between 0.001 and 1%) of Ge material is required to manufacture an equivalent wafer diameter, and benefits in electrostatics and electronics equivalent to those of silicon-on-insulator (SOI) are offered. The presence of an oxide etch stop layer between a thin germanium surface layer and the bulk of the substrate may also be a key enabling feature in other technologies such as concentrator photovoltaics.

A desirable GeOI substrate consists of a thin, uniform thickness layer of defect-free Ge strongly bonded to an oxidized silicon wafer. However, there are several significant challenges for manufacturing GeOI wafers which have not yet been resolved, giving rise to high costs and poor material qualities. Three known methods for manufacturing GeOI substrates are described below.

A first known method is to use layer transfer from a donor Ge wafer. Layer transfer techniques include the well known Smarcut® in which ions are deposited for the purpose of forming a cleave plane just beneath a top surface of the donor Ge wafer. The oxidized surface of a silicon receiver wafer is bonded to the top surface of the donor wafer. The donor and receiver wafers are then separated along the cleave plane so that a thin layer of Ge remains on the oxidized silicon. The surface roughness of the transferred Ge layer is higher than that obtained in similar techniques for producing SOI wafers, and additional polishing is necessary to remove this additional roughness resulting in thickness non-uniformity of the Ge layer. This makes it difficult to produce ultra-thin Ge layers with requisite thickness uniformity for advanced Ge CMOS applications, for example where partially or fully depleted devices are desired. Additionally, the cost of the Ge donor wafer is high, and restoring the surface quality of the Ge donor wafer to a level where it can be reused is difficult.

A second known method is to epitaxially grow a SiGe grade on a silicon donor wafer and to epitaxially grow Ge on the SiGe grade. A layer of the Ge is then transferred to an oxidized silicon receiver wafer. This is another commonly used method for producing larger diameter GeOI and SiGeOI wafers up to 300 mm in diameter. However, the threading dislocation density (TDD) of pure Ge films grown on SiGe grades is on the order of $10^6$ to $10^8$ cm$^{-2}$. This level of defects significantly degrades performance both within the Ge layer and within any subsequent layers grown on it. The surface roughness of the epitaxial layers remaining on the donor wafer after layer transfer has to be restored after use by polishing to enable spontaneous bonding of a newly grown Ge layer. Growth of a Ge film on a full Si—Ge grade, with an intermediate CMP (chemical mechanical polishing) stage is slow and expensive. It is difficult to selectively etch transferred upper layers of the SiGe grade, which has high Ge content, from the pure Ge film transferred to the receiver wafer.

A third known method is to begin with a SiGe-on-insulator (SiGeOI) wafer and to use a Ge condensation method to arrive at a GeOI wafer. The thin layer of the SiGe is oxidized, such that Ge is pushed along the oxidation front resulting in pure Ge at the boundary with the buried insulating oxide layer. The overlying material is then removed. However, high levels of dislocation defects have been reported for GeOI wafers manufactured using this method. The defects are driven by strain relaxation during the process due to the lattice constant at the original SiGeOI interface being equivalent to the transferred SiGe. Despite the questionable quality, most GeOI wafers with diameters greater than 150 mm are currently produced by this method.

The invention seeks to address these and other problems of the related prior art.

SUMMARY OF THE INVENTION

The invention relates to forming a layer of GaAs or a germanium material which is then transferred to a receiver substrate. The germanium material may be, for example, SiGe material with a minor proportion of silicon, the SiGe material being substantially lattice matched to GaAs.

The invention provides a method of forming a thin film or layer of germanium material, or of GaAs. A layer of one of these materials is transferred to another substrate, for example using an ion implant/cleavage or similar technique such as Smartcut®. A residual of the other material attached either to the transferred layer or the remaining material can be removed to leave an original surface exposed by selective etching using the GaAs/germanium material interface as an etch stop.

For example, the invention may be applied to the formation of germanium-on-insulator type substrates, by epitaxially growing a germanium material on a GaAs donor substrate, and carrying out layer transfer of the germanium material along with some residual GaAs to a receiver substrate. The residual GaAs may then be removed, with the GaAs/germanium material boundary acting as an etch stop to selective wet etching or similar. An equivalent process may be used to form a GaAs-on-insulator type substrate by growing GaAs material on a Ge donor substrate, and following equivalent steps.

The hetero-interface between the germanium material and the residual GaAs (or vice-versa) in the transferred layer provides an etch stop allowing the residual GaAs to be removed using etchants selective for GaAs leaving only the germanium material on the receiver substrate. The germanium material may be germanium, or SiGe with a minor silicon component consistent with approximate lattice matching of the SiGe to the GaAs donor substrate. More generally in this document, the germanium material may be a material in which the mole fraction of germanium is at least 0.5, at least 0.7, or optionally at least 0.9. The germanium material may be substantially lattice matched to GaAs. The germanium material and the GaAs are preferably monolithically formed with each other, that is monocrystalline. The germanium material may exhibit a range of compositions, for example comprising a grade between two different SiGe compositions.

The technique enables thin, uniform layers of defect free germanium or SiGe to be transferred onto alternative substrates. The CMP stage commonly used to remove cleave/implant damage and restore micro-roughness for subsequent epitaxial growth at the surface of the transferred layer is replaced with a selective etch to remove the residual GaAs. This etch stops at the germanium material allowing very uniform thin layers of transferred germanium material to be achieved. The growth of relaxed germanium material on lattice matched GaAs leads to very low defect levels compared with germanium materials grown on a SiGe grade. GaAs donor wafers are generally cheaper than equivalent Ge wafers, and the GaAs donor wafer can be reused if a layer transfer technique which leaves the donor substrate largely intact is used.

Multiple cycles of GaAs and germanium material may be epitaxially grown on the GaAs donor substrate, before being sequentially removed by repeating the layer transfer to form multiple germanium-on-insulator type substrates The ability to produce thin uniform germanium-on-insulator material is particularly important for GeOI based CMOS in which partially and fully depleted architectures are used, but the technique is also applicable to a wide range of other uses such as photovoltaics, optoelectronics, and III/V integration with silicon.

In particular, the invention provides a method of carrying out layer transfer of first material which is either GaAs or a germanium material, comprising: epitaxially growing said first material on a surface of a second material which is the other of either GaAs or a germanium material, said surface being carried by a donor substrate; carrying out layer transfer of the first material from the donor substrate to a receiver substrate with one of: residual second material from adjacent to said surface attached to said transferred first material; and residual first material from adjacent to said surface attached to said second material; and removing the attached residual material to thereby expose the underlying first or second material (depending on which was covered by the residual material).

Whether the residual material is attached to transferred first material, or to the remaining second material, depends upon the plane (for example a cleave plane or layer) along which the first and second materials are separated, and in particular whether this plane lies above or below the said surface.

The germanium material may be germanium, silicon germanium $Si_xGe_{1-x}$, or another germanium material such as SiGeC, or some combination of such compositions. For acceptable lattice matching of SiGe with GaAs the value of x should preferably be below 0.06, more preferably be below 0.04, and more preferably still range from 0.01 to 0.03. The germanium material may be substantially lattice matched to GaAs, such that an acceptably low level of defects results, for example by requiring that the lattice constant of the germanium material be within +−0.08% of the lattice constant of GaAs, although other suitable criteria are discussed below. The invention may also be used to form thin layers of germanium material such as SiGe in which the mole fraction of at least some of the germanium material is significantly less, for example in a range from 0.5 to 1.0 or 0.7 to 1.0. This may be achieved by growing a germanium material grade to the lower germanium mole fraction material and carrying out layer transfer of the germanium material including part or all of the grade.

Materials described herein may be grown by CVD or similar techniques, and may or may not be doped to facilitate the formation of p-n junctions.

The receiver substrate may comprise an insulator layer and the layer transfer of the transfer layer of the first material may then be onto the insulator layer to form a first material on insulator substrate. For example, the receiver substrate may be a silicon substrate and the insulator layer may comprise an oxide of silicon. Other receiver substrates of various kinds comprising semiconductor materials, insulators, glasses, metals and so on may be used as desired.

The layer transfer may be carried out in various ways known to the skilled person. For example, the step of carrying out layer transfer may comprise implanting ions to initiate a cleave layer in the second material beneath said surface, bonding the first material (along with any further layers added on top of the first material) to the receiver substrate, and separating the receiver substrate from the donor substrate along the cleave layer to leave residual second material from adjacent to said surface attached to said transferred first material. If the cleave layer is within the first material above the surface then the residual first material will be from adjacent to said surface attached to the remaining second material. The layer transfer may also be achieved by grinding away a bulk of the donor substrate.

The attached residual material can be removed in one or several ways, including grinding, polishing, etching and so forth. However, the removal preferably comprises removing at least some of the residual material by selective etching to which the other of the first and second materials is unresponsive, to thereby leave the remaining material with its original grown surface. In particular, selective wet etching may be used to remove a final portion of the attached residual material to expose the underlying first or second material.

Conveniently, the donor substrate may be a GaAs substrate. In this case, the surface of the second material may be a GaAs surface of the GaAs substrate. However, the surface of the second material may instead be the surface of an epitaxially grown layer of the second material, which may be grown on a GaAs surface of a GaAs substrate, or on a different underlying surface such as an epitaxially grown layer of the first material.

Similarly, the donor substrate may be a Ge substrate. In this case, the surface of the second material may be a Ge surface of the Ge substrate. However, the surface of the second material may instead be the surface of an epitaxially grown layer of the second material, which may be grown on a Ge surface of a Ge substrate, or on a different underlying surface such as an epitaxially grown layer of the first material.

A related aspect of the invention provides growing repeated alternating layers of the first and second materials, such that repeated layer transfer can be used each to a separate receiver substrate, with corresponding multiple steps of removing attached residual material.

When the above methods are used to carry out layer transfer from a donor substrate without grinding away a bulk or majority of the substrate, the donor substrate may then be reused to carry out a repeat of the same process one or multiple times, or for other processes or uses. Use of the above methods in the manner in which the residual material is second material left attached to the first material on the donor substrate allow an original GaAs surface, on which a germanium layer to be transferred was formed, to be recovered accurately using the selective etching technique already mentioned. If the surface remaining on the donor substrate after layer transfer is cleaved second material then steps of polishing and similar as familiar to the skilled person may be used to recover the donor substrate for further use or reuse.

The above methods may be used to provide a surface on which other structures are formed. In one example such further structures comprise one or more photovoltaic junctions, which may be monolithically formed on the transferred first material.

In some other aspects, the invention provides a method of fabricating a thin film of a germanium material, comprising: epitaxially growing a layer of germanium material on a GaAs donor substrate; carrying out layer transfer of the layer of germanium material with residual GaAs from the donor substrate to a receiver substrate; and removing the residual GaAs material to expose the layer of germanium material. The invention also provides the corresponding method of fabricating a thin film of a GaAs material, comprising: epitaxially growing a layer of GaAs material on a Ge donor substrate; carrying out layer transfer of the layer of GaAs material with residual germanium material from the donor substrate to a receiver substrate; and removing the residual germanium material to expose the layer of GaAs material. Substrates, removal of residual material, and other aspects may be as described elsewhere herein.

The germanium material may be of a homogenous composition, or the composition may vary through the material, for example by changing the composition during layer growth. An application of this is to provide a method of forming a thin layer of a germanium material which is lattice mismatched to GaAs. A SiGe grade is grown on a donor substrate, and a top layer of germanium material (which may effectively be the top part of the grade, or an additional layer) is grown on the grade. The top layer, preferably along with part of the SiGe grade or all of the SiGe grade and a residual of GaAs material on which the SiGe grade was grown, is then layer transferred to a receiver substrate, and any residual material from below the layer is removed as required, and the remaining surface of the germanium material on the receiver substrate is prepared as necessary for further use. The germanium material may be lattice matched to the top of the grade. Alternatively, it may be deliberately lattice mismatched, to yield a strained germanium material layer on the receiver substrate.

The invention also provides methods of forming a device, comprising the method steps set out above, such a device being an opto-electronic device, a fully depleted Ge based CMOS device, or a III/V on silicon device.

The invention also provides products of the described methods, including a substrate carrying a layer of said first material, formed according to any of the described methods. A particular end product so formed is a GeOI or SiGeOI substrate, which may have reduced defect densities for similar sized substrates formed according to prior art methods. Such germanium or SiGe on insulator substrates may comprise the germanium material overlying an insulator such as a silicon oxide, which may be formed on a silicon substrate.

The invention may be used to provide a structure upon which a photovoltaic device is built, for example as described in the commonly filed and copending patent application entitled "Photovoltaic Cell" the entire contents of which is hereby incorporated by reference for all purposes.

The invention also provides a photovoltaic device so constructed, such as a solar cell.

The invention also provides one or more of an opto-electronic device, a fully or partially depleted Ge based CMOS device, and a III/V on silicon device, formed using the described methods.

The invention may be applied to whole semiconductor wafers, for example where the donor and receiver substrates are donor and receiver wafers.

BRIEF DESCRIPTION OF THE DRAWINGS

Embodiments of the invention will now be described, by way of example only, with reference to the accompanying figures of which.

DESCRIPTION OF EMBODIMENTS

Figure 1A:
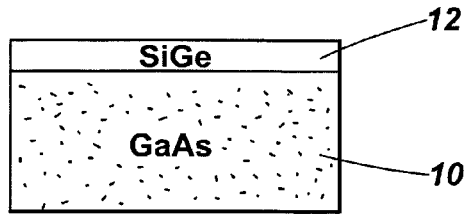
FIGS. 1A to 1E show schematically layer transfer of a SiGe layer from a GaAs donor substrate to a receiver substrate, wherein the layer transferred carries some residual GaAs.

Referring now to FIGS. 1A to 1E there are shown a series of stages in the formation of a thin layer of a germanium material on a substrate. In FIG. 1A a GaAs donor substrate 10 has been provided, and a layer 12 of germanium material has been epitaxially grown on the donor substrate. In this case, the germanium material is a silicon germanium material (SiGe).

Figure 1B:
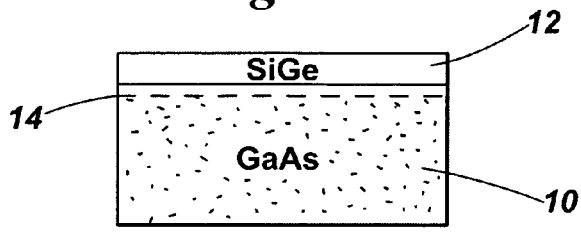

In FIG. 1B a cleave plane 14 has been initiated in the GaAs material of the donor substrate beneath the layer 12 of silicon germanium, for example by implanting ions through the layer 12 using an ion beam process.

Figure 1C:
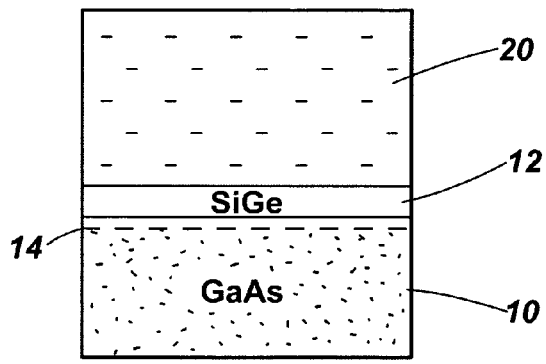

In FIG. 1C a receiver substrate has been bonded to the SiGe layer 12. An annealing step may be used to improve the bonding between the receiver substrate and the SiGe layer, and also to weaken the cleave plane, in a manner known to the skilled person from the Smartcut® technique.

Figure 1D:
Figure 1D:
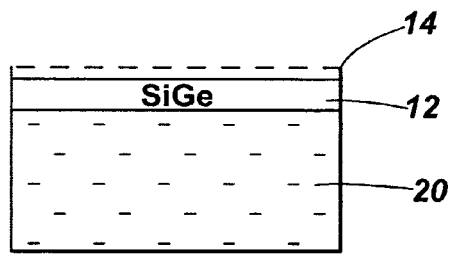

The donor and receiver substrates are then separated as shown in FIG. 1D so that the receiver substrate carries the layer 12 of SiGe and a layer of residual GaAs material from the original donor substrate.

Figure 1E:
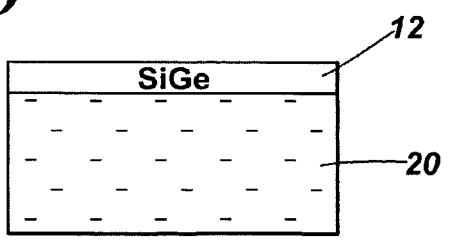

The layer of residual GaAs material can be removed by a variety of techniques such as grinding, polishing and etching, to leave the epitaxially grown layer of germanium material exposed upon the receiver substrate as shown in FIG. 1E. Preferably, at least a final portion of the residual GaAs material is removed by an etching process, such as a wet etching process, to which the germanium material is unresponsive.

The remaining GaAs donor wafer 10 can be reused, after any necessary repolishing or other surface preparation techniques.

The process of transferring the epitaxial layer of germanium material from the donor substrate to the receiver substrate may be referred to as a layer transfer process. A number of different techniques may be used to achieve this effect, and multiple steps may be needed to carry out such techniques, these steps being carried out before, after, or both before and after epitaxial growth of the layer 12 of germanium material. For example, an alternative layer transfer technique involves grinding away the bulk of the donor wafer, instead of using a cleave plane technique. An etching process can still then be used to remove a residual layer of GaAs.

Figure 2A:
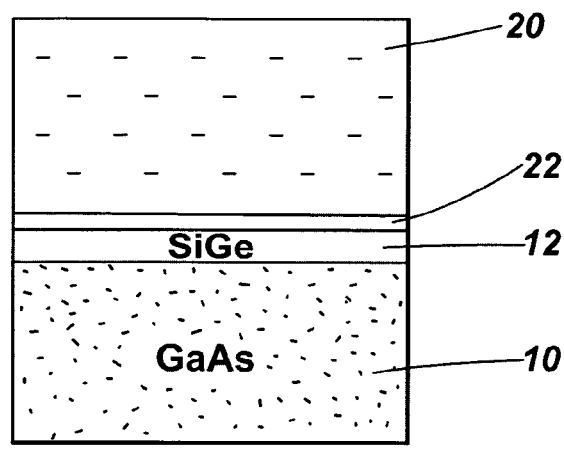
FIGS. 2A and 2B show some of the stages of FIG. 1, where the receiver substrate carries an insulator layer.
Figure 2B:
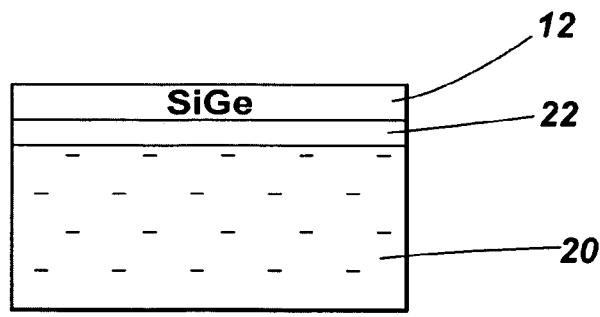

Receiver substrates of various materials and structures may be used to accept the germanium material layer 12, such as metals, semiconductors, insulators, glasses, and combinations of such materials. To form a germanium material-on-insulator substrate a receiver substrate with an insulator layer is used for receiver substrate 20. This variation is illustrated in FIG. 2A, which may be compared with FIG. 1C. In FIG. 2A the receiver substrate carries an insulator layer 22, and it is this insulator layer which is bonded to the layer 12 of germanium material, resulting in a final structure as shown in FIG. 2B.

The germanium material may be, for example, germanium or SiGe. Another possible germanium material is SiGeC. If the material is SiGe then the composition denoted by x in $Si_xGe_{1-x}$, may be varied as long as the material remains substantially lattice matched with the GaAs material of the donor substrate. Ideal lattice matching occurs at around x=0.018, and preferably x takes a value from about 0.01 to 0.03, although values from x=0 (germanium) to x=0.04, or further to x=0.06 may provide germanium material of reasonable material quality for many purposes. As the proportion of silicon is increased, the lattice mismatch with GaAs increases by about 0.04% for each change in x of 0.01, and the consequent defects in the crystal structure of the germanium material increase in number.

A suitable range of lattice parameters for the germanium material to remain suitably lattice matched with GaAs may therefore be a deviation of up to +−0.16% from the GaAs lattice parameter, and more preferably up to +−0.08%, and more preferably still in the range of +−0.04%. The germanium material may contain dopants and other impurities at low levels.

The process illustrated in FIG. 1A to 1E may typically be carried out using conventional type semiconductor wafers. The GaAs donor wafer may typically be between about 100 μm and 1000 μm in thickness, with greater thicknesses being typical for larger wafers. The receiver wafer may be a silicon wafer on which a layer of oxide has been grown to provide insulator layer 22. The layer 12 of epitaxial germanium material may typically be between about 1 nm and 2 μm in thickness, depending on the end application. Some CMOS circuitry applications may typically benefit from thinner layers than some optical and photovoltaic applications. The cleave plane may typically be formed about 0.1 to 2 um below the surface of the GaAs, or below the surface of the layer 12, but such that the cleave plane lies at least slightly within the GaAs material.

Figure 3:
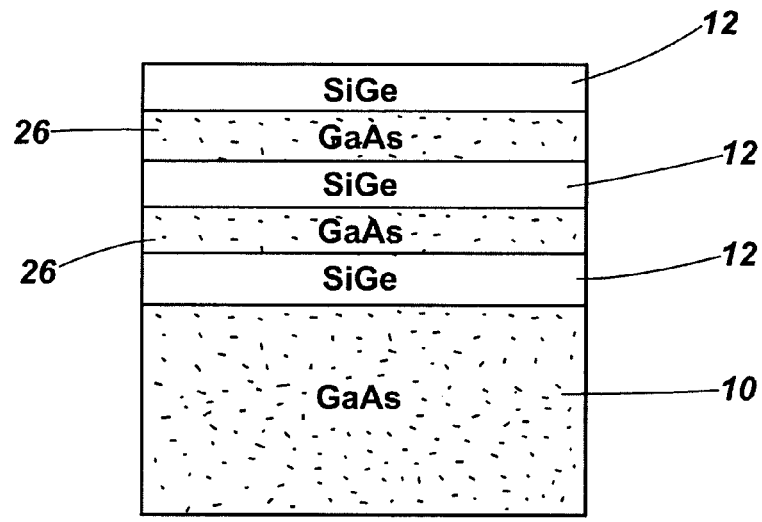
FIG. 3 illustrates a technique in which multiple alternating layers are grown and then removed to multiple receiver substrates using successive layer transfer steps.

The approach described above can be extended by two or more epitaxial layers of a germanium material on the donor substrate, as shown in FIG. 3, and then carrying out multiple layer transfer steps to remove each layer 12 in reverse sequence. Each pair of germanium material layers 12 is separated by a layer 26 of GaAs also grown epitaxially. The required cleave layers can be initiated within some or all of the GaAs substrate and GaAs layers between growth steps, but it may be advantageous to form all of the epitaxial layers without removing the structure from a suitable reaction chamber, and then carry out any necessary ion implant or other such cleave plane initiation steps after the epitaxial layers are completely formed.

Figure 4:
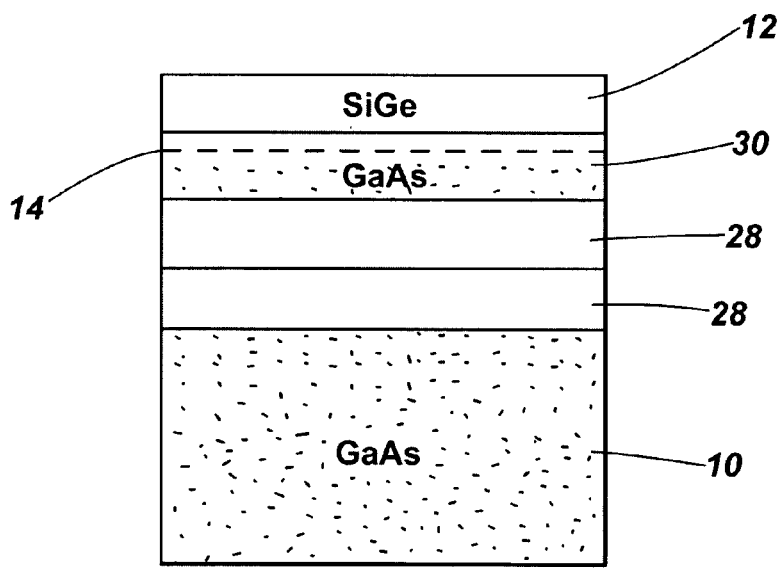
FIG. 4 illustrates the technique applied to a SiGe layer over an epitaxially grown GaAs layer.

More generally, as illustrated in FIG. 4, the technique can be applied to an epitaxial layer of a germanium material overlying epitaxial GaAs material 30, wherein one or more further layers 28 may lie between the GaAs material 30 and the GaAs substrate. In this more general case the technique described above may still be used to carry out layer transfer of the germanium material layer 12, for example including forming a cleave plane 14, completing the layer transfer to a receiver substrate, and selectively etching the residual GaAs from the germanium material layer 12 on the receiver substrate.

Figure 5A:
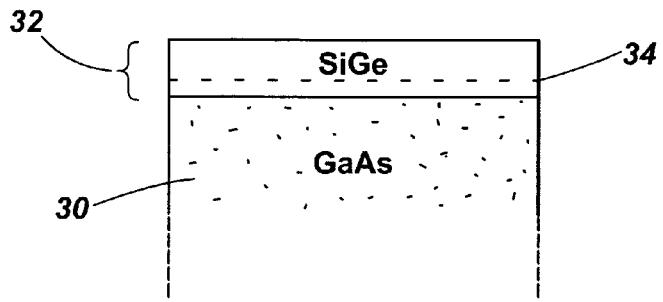
FIGS. 5A to 5C show schematically layer transfer of a SiGe layer from a GaAs donor substrate, wherein the layer transferred leaves behind some residual SiGe.

In FIG. 5A, GaAs material 30 underlies an epitaxial layer 32 of a germanium material as described above, for example as in respect of FIG. 4. The GaAs material 30 may be the top part of a GaAs substrate, or may be an epitaxially grown layer. In a variation of the techniques described above, a cleave plane 34 is formed in the germanium material layer 32. An upper portion of the germanium material layer is then transferred to a receiver substrate 20, for example by completing a layer transfer technique as used above. The germanium material transferred to the receiver substrate can then be polished or otherwise prepared for use, and the lower portion of the germanium material layer remaining on the GaAs can be removed by a variety of techniques preferably including at least the final portion of this material being removed using a selective etch to which GaAs is unresponsive. The resulting structures are shown in FIG. 5C. This variation leaves available an etched surface of the GaAs material 30 for further use in any manner required.

Figure 5B:
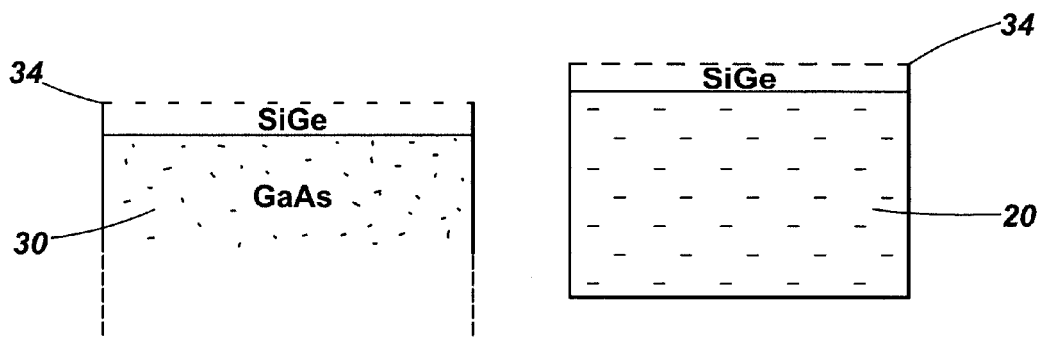
Figure 5C:
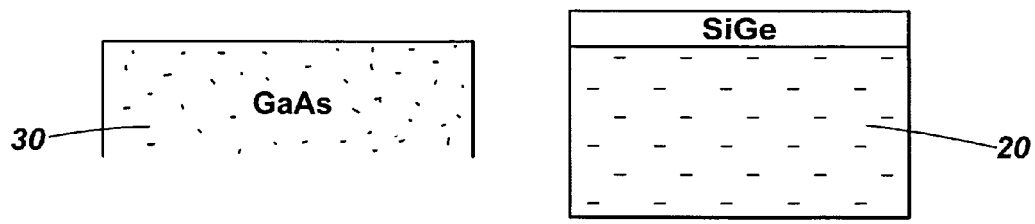

The technique of FIG. 5 can be applied to one or more of the repeated layers of the structure of FIG. 4.

Figure 6A:
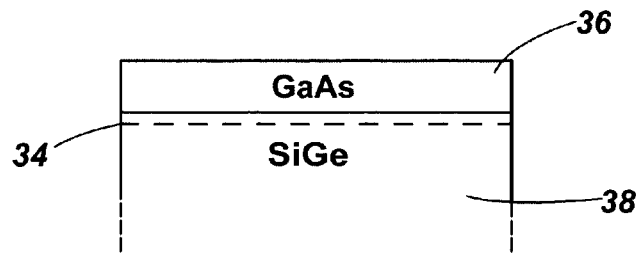
FIGS. 6A to 6D show a process similar to that of FIG. 1, in which a layer of GaAs is transferred off an underlying Ge layer or SiGe layer or Ge substrate.
Figure 6B:
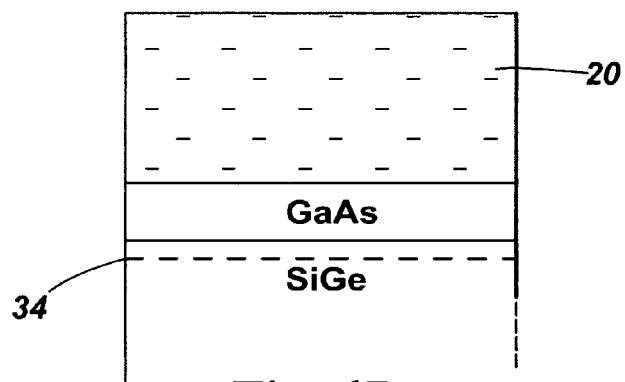
Figure 6C:
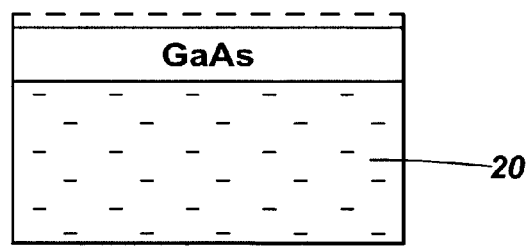
Figure 6D:
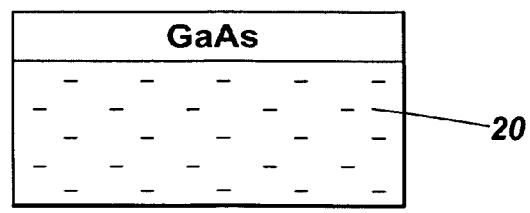

The techniques described above can also be used to form thin films of GaAs. Referring to FIG. 6A, a layer 36 of GaAs is grown epitaxially on a germanium material 38. A cleave plane 34 may be initiated in the germanium material. A receiver substrate 20 is bonded to the GaAs layer 36, as shown in FIG. 6B, and the received substrate is separated from the germanium material 38 to thereby effect layer transfer of the GaAs layer 36 to the receiver substrate. A residual amount of the germanium material is also transferred, as illustrated in FIG. 6C, and this can be removed. In particular, at least a final part of the residual germanium material may be removed using a selective etch to which the GaAs is unresponsive, to result in the structure of FIG. 6D in which a thin exposed GaAs layer is bonded to the receiver substrate. Some variations on this, already presented in respect of germanium material grown on GaAs, include: forming the cleave plane in the GaAs instead of the germanium material; and using grinding to remove all or a bulk of the donor wafer carrying the germanium material surface.

The technique illustrated in FIGS. 6A-6D can be applied to a stack of alternating epitaxial layers of a germanium material and GaAs similar to that shown in FIG. 4, to carry out layer transfer of successive GaAs layers from a single donor substrate. The technique can also be applied to a GaAs layer formed on a germanium substrate.

Figure 7:
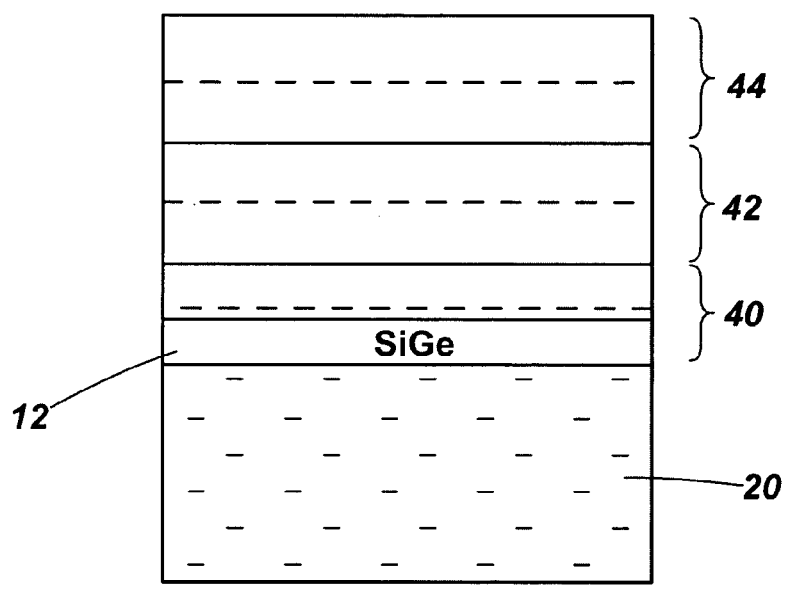
FIG. 7 shows a single or multi junction solar or photovoltaic cell comprising junctions formed or grown over a transferred layer as illustrated in the previous figures.

A layer of GaAs or of a germanium material formed according to the invention can be used as part of a photovoltaic cell. FIG. 7 illustrates such as cell in which a receiver substrate which may be or comprise a metal layer carries a layer of germanium material on which is formed, or is part of a germanium photovoltaic junction 40. Further photovoltaic junctions may be monolithically formed over the germanium junction, for example a GaAs junction 42 followed by an InGaP junction 44 to form a triple junction solar cell. Typically, each overlying photovoltaic junction will have a bandgap energy higher than each underlying junction, so that longer wavelength light propagates to underlying junctions for absorption and conversion to electrical power at a more optimal bandgap. Electrical contacts, junction layers, window layers and similar are not shown in FIG. 7 for the purposes of simplicity, but clearly may be included as appropriate according to the usual practice and knowledge of the skilled person.

Figure 8A:
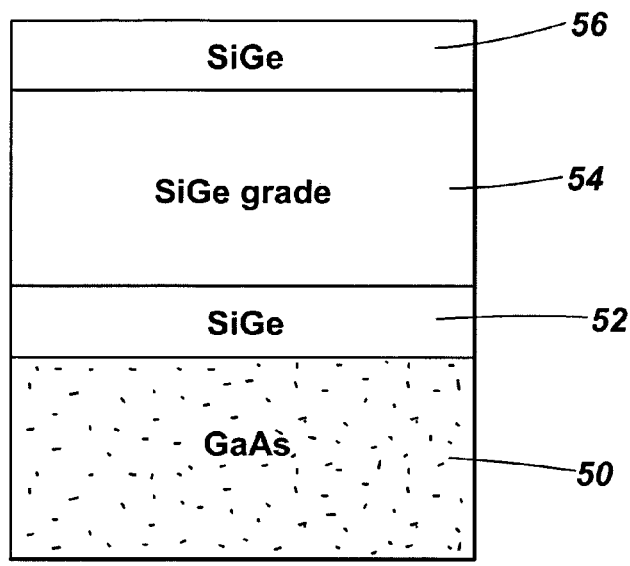
FIGS. 8A and 8B illustrate the invention being applied to transfer of a SiGe or other germanium material layer having a composition not lattice matched to GaAs being grown on a suitable SiGe grade and then being transferred to a receiver substrate.
Figure 8B:
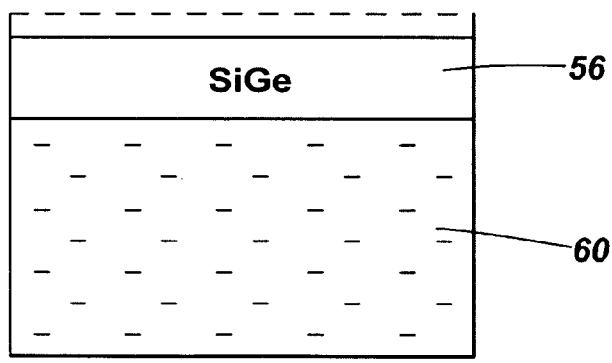

Referring to FIGS. 8A and 8B there is illustrated a technique by which a layer of a germanium material not lattice matched to GaAs can be formed and transferred to an alternative substrate, using techniques and materials as already described above. A first layer of a germanium material 52 such as SiGe which is substantially lattice matched to GaAs or Ge is epitaxially grown on a donor substrate 50, which may typically be a GaAs or Ge substrate. To be substantially lattice matched to GaAs to minimise defects the SiGe should have a silicon fraction of about 0.02, or more generally in the range zero to about 0.04, although other criteria set out elsewhere in this document can also be applied. A SiGe grade 54 in which the silicon fraction is increased as the grade is grown upwards is then formed, so that the silicon fraction is higher at the top of the grade than in the first layer 52. A second layer 56 of SiGe having a silicon fraction matching the top of the grade 52 is then grown.

A layer transfer technique is then used to transfer material of the second SiGe layer 56 to a receiver substrate 60. This may involve transferring the whole germanium material structure, including some residual GaAs material to the receiver substrate, or transferring the second layer 56 of SiGe with some residual SiGe material from the grade 52. The layer transfer technique may use a cleavage plane to remove a bulk of the material, or a grinding technique may be used for this purpose, or some other layer transfer technique may be used. Finally, any residual material of the donor substrate or grade which is also carried in the layer transfer process may be removed, and the exposed face of the transferred SiGe layer may be polished and otherwise prepared as necessary for further use. The receiver substrate may take a variety of forms as set out in other examples above. The donor substrate may be of different compositions and lattice constants, but generally the bottom of the SiGe grade should match the substrate in lattice constant.

Figure 9A:
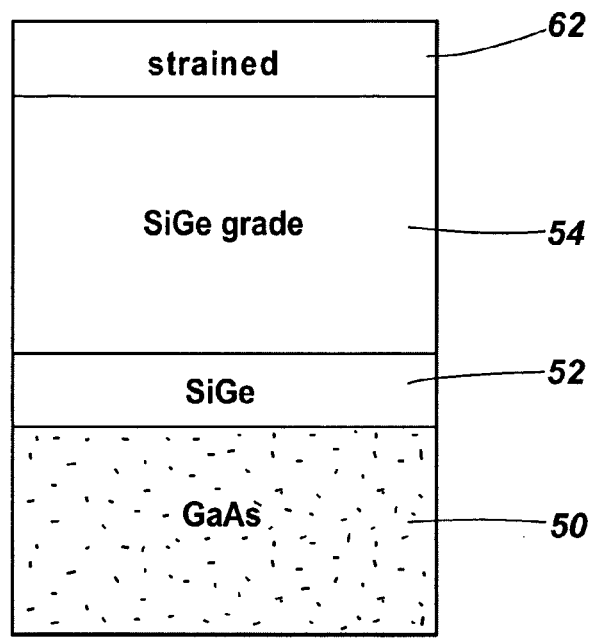
FIGS. 9A and 9B are similar to FIGS. 8A and 8B, but the layer of germanium material is deliberately strained, being lattice mismatched to the top of the SiGe grade.
Figure 9B:
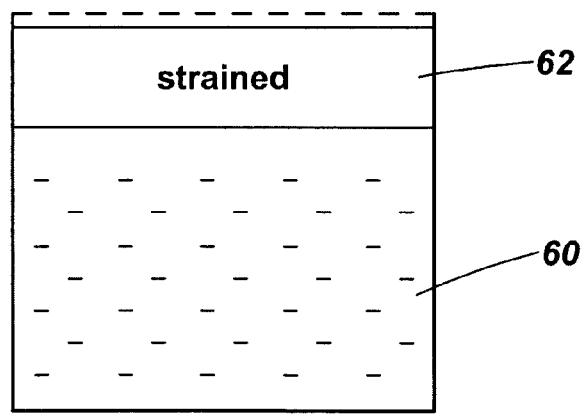

In a variation on the technique illustrated in FIGS. 8A and 8B, a layer of strained germanium material 62 may be grown in place of the lattice matched germanium material 56, as shown in FIGS. 9A and 9B. A layer of strained germanium material 62 is thereby transferred to the receiver substrate as shown in FIG. 9B. In particular, the layer 62 may be compressively strained. The strained germanium material may be, for example, strained SiGe or strained Ge.

Compressively strained germanium material layers may be beneficial in terms of enhanced carrier mobility when compared with non-strained equivalents.

The layer transfer of SiGe over a SiGe grade on GaAs or Ge enables high Ge fraction material to be produced with less grading then conventional approaches which start with a silicon substrate and gradually increase the Ge fraction to the required level. Consequently, high Ge fractions, for example over 0.7, can be achieved with fewer dislocation defects and without the need for an intermediate CMP stage to reduce pile-up defects and restore surface planarity.

Although a variety of examples have been described, the skilled person will be aware that variations and modifications to these examples may be made without departing from the scope of the invention.

The invention claimed is:

1. A method of forming a thin film of a germanium material, comprising:
    epitaxially growing said germanium material on a surface of GaAs, said surface being carried by a donor substrate;
    carrying out layer transfer of the germanium material from the donor substrate to a receiver substrate with residual GaAs material from adjacent to said surface attached to said transferred germanium material; and
    removing the attached residual GaAs material leaving only the germanium material on the receiver substrate,
    wherein the germanium material is silicon germanium, denoted as $Si_xGe_{1-x}$, such that x is in the range from 0.01 to 0.03.

2. The method of claim 1 wherein the germanium material and GaAs are substantially lattice matched.

3. The method of claim 1 wherein the receiver substrate comprises an insulator layer and the layer transfer of the transfer layer of the germanium material is onto the insulator layer to form a germanium material on insulator substrate.

4. The method of claim 3 wherein the receiver substrate is a silicon substrate and the insulator layer comprises an oxide of silicon.

5. The method of claim 1 wherein the step of carrying out layer transfer comprises implanting ions to initiate a cleave layer in the GaAs beneath said surface, bonding the germanium material to the receiver substrate, and separating the receiver substrate from the donor substrate along the cleave layer to leave residual GaAs from adjacent to said surface attached to said transferred germanium material.

6. The method of claim 1 wherein the step of removing the attached residual material comprises removing at least some of the residual material by selective etching to which the germanium material is unresponsive.

7. The method of claim 6 wherein selective wet etching is used to remove a final portion of the attached residual material to expose the underlying germanium material.

8. The method of claim 1 wherein the donor substrate is a GaAs substrate.

9. The method of claim 8 wherein the surface of the GaAs is a GaAs surface of the GaAs substrate.

10. The method of claim 1 wherein the surface of the GaAs is the surface of an epitaxially grown layer of GaAs.

11. The method of claim 10 wherein the epitaxially grown layer of germanium material is formed on an epitaxially grown layer of GaAs.

12. The method of claim 11 comprising: epitaxially growing a plurality of alternate layers of said GaAs and germanium material, and after growing all of said layers, carrying out multiple said steps of layer transfer each to a separate receiver substrate and corresponding multiple said steps of removing attached residual material.

13. The method of claim 1 further comprising the steps of:
    growing a SiGe grade on the surface of GaAs before the growth of the germanium material, the SiGe grade being from a first SiGe composition to a second SiGe composition;
    wherein the first composition is substantially lattice matched to GaAs, and the second composition has a higher silicon fraction than the germanium material; and
    carrying out layer transfer of at least some of the germanium material to a receiver substrate.

14. The method of claim 13 wherein the further layer of germanium material has a composition matching the second composition.

15. The method of claim 13 wherein the layer transfer includes layer transfer of the SiGe grade and residual material from the donor substrate.

16. The method of claim 13 wherein the donor substrate is a GaAs substrate.

17. The method of claim 1 further comprising monolithically forming one or more photovoltaic junctions on at least some of the transferred germanium material, to form a photovoltaic cell.

18. The method of claim 1 further comprising forming one of an opto-electronic device, a fully or partially depleted Ge based CMOS device, and a III/V on silicon device, the device comprising the thin film.

19. An apparatus comprising:
a substrate carrying a layer of at least some of a thin film of germanium material, formed by:
expitaxially growing said germanium material on a surface of GaAs, said surface being carried by a donor substrate;
carrying out layer transfer of the germanium material from the donor substrate to a receiver substrate with residual GaAs material from adjacent to said surface attached to said transferred germanium material; and
removing the attached residual GaAs material leaving only the germanium material on the receiver substrate,
wherein the germanium material is silicon germanium, denoted as $Si_xGe_{1-x}$, such that x is less than 0.05.

20. The apparatus of claim 19, wherein the substrate is an insulator substrate.

21. The apparatus of claim 20 wherein the substrate is silicon oxide over silicon.

22. The apparatus of claim 19, wherein the apparatus is a solar cell.

23. The apparatus of claim 19 wherein the apparatus is at least one of an opto-electronic device, a fully depleted Ge based CMOS device, a partially depleted Ge based CMOS device and a III/V on silicon device.

* * * * *

UNITED STATES PATENT AND TRADEMARK OFFICE
CERTIFICATE OF CORRECTION

PATENT NO. : 9,048,289 B2  Page 1 of 1
APPLICATION NO. : 13/202401
DATED : June 2, 2015
INVENTOR(S) : Robert Cameron Harper It is certified that error appears in the above-identified patent and that said Letters Patent is hereby corrected as shown below:

In the Claims

In Column 11, Claim 14, beginning on line 1, immediately following "The method of claim 13" please insert -- further comprising epitaxially growing a further layer of germanium material on the SiGe grade --.

Signed and Sealed this
Twenty-second Day of December, 2015

Michelle K. Lee
*Director of the United States Patent and Trademark Office*